United States Patent [19]

Thorwarth

[11] 4,418,264
[45] Nov. 29, 1983

[54] DEVICE AND METHOD FOR REPAIRING CONDUCTOR PATH BREAKS BY WELDING

[75] Inventor: Rüediger Thorwarth, Glonn, Fed. Rep. of Germany

[73] Assignee: Siemens Aktiengesellschaft, Berlin and Munich, Fed. Rep. of Germany

[21] Appl. No.: 281,328

[22] Filed: Jul. 8, 1981

[30] Foreign Application Priority Data

Jul. 8, 1980 [DE] Fed. Rep. of Germany ....... 3025875

[51] Int. Cl.³ .............................................. B23K 11/32
[52] U.S. Cl. ............................... 219/78.01; 29/402.16; 219/86.9; 219/86.21; 219/119; 219/158
[58] Field of Search .................. 219/119, 78.01, 86.21, 219/86.9, 158; 29/402.16

[56] References Cited

U.S. PATENT DOCUMENTS 2,504,509  4/1950  Erickson .......................... 29/402.16
3,342,972  9/1967  Penberg .............................. 219/119

Primary Examiner—Elliot A. Goldberg
Attorney, Agent, or Firm—Hill, Van Santen, Steadman, Chiara & Simpson

[57] ABSTRACT

To repair conductor path interruptions on printed circuit boards by means of micro-resistance welding, a specifically shaped metallic part is sucked on a central electrode by use of vacuum. The central electrode lowers the part so as to bridge the conductor path interruption to be repaired. On each side of the central electrode an outer electrode is provided which are lowered into contact with ends of the shaped part to provide independent micro-resistance welding at each end thereof by use of separate welding pulses, with the central electrode functioning in common for each welding.

5 Claims, 2 Drawing Figures

DEVICE AND METHOD FOR REPAIRING CONDUCTOR PATH BREAKS BY WELDING

BACKGROUND OF THE INVENTION

The invention concerns a device for the repair of conductor path interruptions or breaks on printed circuit boards by means of microwelding.

In the case of new generation printed circuit boards, the conductor paths no longer run in a straight line, but rather are designed meander-like in trapezoidal conductor paths. The conductor paths produced by means of etching have, for example, a height of 30 $\mu$m and a width of 120 to 150 $\mu$m. The base length of a trapezoid is, for example, 1.20 mm.

In the case of the manufacturing process, interruptions can arise in the conductor paths. Since the printed circuit boards after placement of components are subjected to a soldering process, the repairing of the conductor paths must be carried out with a method whereby it is assured that the repair points suffer no damage as a result of the temperature arising by means of the soldering, and that the connections do not break again. Such a method is micro-resistance welding. In the magazine Feinwerktechnik, 75, 1971, Pamphlet 5, pp. 201-206, incorporated herein by reference, a method is described whereby through means of micro-resistance welding with a constant voltage device and gap electrodes with the use of nickel strips or wires, constricted or broken conductor paths are repaired on through-connection printed circuit boards.

In the case of straight conductor paths, the interruption was bridged by means of a suitable repair strip which was soldered on at both sides of the interruption one after the other by means of emplacement electrodes. The positioning thereby proceeded by means of a separate suction nozzle which was removed after the production of the first spot weld.

SUMMARY OF THE INVENTION

It is an object of the invention to design a device for the repair of conductor path interruptions on printed circuit boards which simultaneously makes possible the correct positioning of the parts to be welded and also welds, to thereby simplify the known method. The problem forming the basis of the invention is solved with a device for the welding process of a specific shaped part from a foil strip at both sides of a conductor path interruption, wherein a three-part electrode system is provided which consists of a central inside electrode equipped with a vacuum end for the suctioning of the shaped part, and around which two semicircular-shaped outside electrodes sit concentrically. These electrodes in each case are separated from one another electrically by means of an air gap and further are spring suspended mechanically, independently of one another. With this device it results that simultaneously the inside electrode can take up the shaped part by means of vacuum intake air and thus can both contribute to the positioning and the welding. In this manner, no additional suction nozzle is required.

According to a further development of the invention, the three electrodes are connected to the secondary circuits by two current impulse sources. With releasing of the welding pulses which are separated chronologically from one another via a special clock pulse generator, the inside electrode functions as two electrodes. This has the advantage that the two connection points required for the repair can be carried out in one operation.

According to a further design of the invention, the inside electrode and the outside electrodes are movable independently of one another and the inside electrode is moved down ahead of time. This permits using the inside electrode for positioning purposes.

DESCRIPTION OF THE PREFERRED EMBODIMENTS

Figure 1:
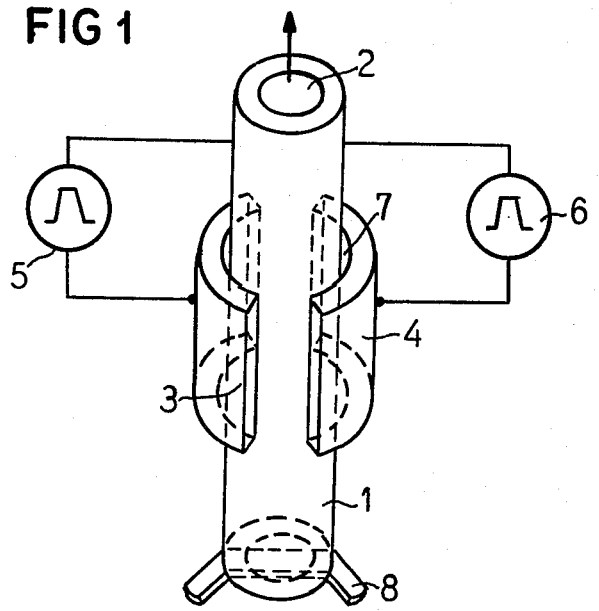
FIG. 1 shows an electrode arrangement in a perspective view with current impulse sources and a shaped part for repairing an interrupted conductor path.
Figure 2:
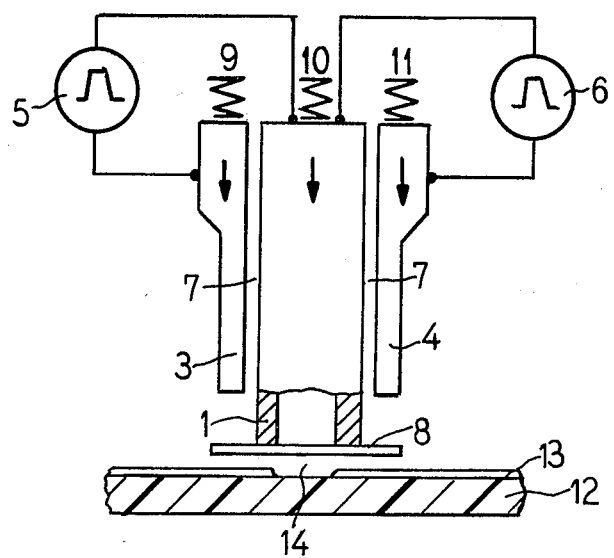
FIG. 2 shows the electrode arrangement in a side view partially in section illustrating the shaped part and also the printed circuit board having an interrupted conductor path.

In the Figures, a central inside electrode 1 with a bore hole 2 for a vacuum end is shown. Concentrically around this inside electrode are arranged two outside electrodes 3,4. The inside electrode 1 is connected on one side to the outside electrode 3 with a current impulse source 5, and on the other side to the outside electrode 4 with a current source 6. An air gap 7 separates the three electrodes electrically and mechanically from one another. On the underside of the inside electrode, a shaped part 8 of a foil strip is sucked on. All three electrodes are spring-suspended independently of one another with the springs 9, 10 and 11. The arrows inside of the electrodes in FIG. 2 indicate the direction of force. In FIG. 2, there is also depicted a conductor path 13 with an interruption 14 on a printed circuit board 12.

For repairing the interruption, a shaped part designed specifically for the interruption is punched out of a foil strip. The inside electrode picks up the shaped part by means of a vacuum air intake from a punch which is not shown. By means of the protruding inside electrode 1, the shaped part 8 can be lowered onto and partially cover the conductor path 13 which is to be repaired. The mechanically generated electrode force holds the shaped part positionally correct on the repair location. The outside electrodes which follow in each case contact the ends of the shaped part. With releasing of welding pulses separated from one another chronologically, the inside electrode functions as two electrodes.

Although various minor modifications may be suggested by those versed in the art, it should be understood that I wish to embody within the scope of the patent warranted hereon, all such embodiments as reasonably and properly come within the scope of my contribution to the art.

I claim as my invention:

1. A device for repairing conductor path interruptions on printed circuit boards by means of micro-resistance welding a specific shaped part from a foil strip at both sides of the conductor path interruption, comprising: a three-part electrode system formed of a central inside electrode equipped with a vacuum connection means for sucking-on the shaped part, and around which two semicircular-shaped outside electrodes sit concentrically, the three electrodes in each case being separated from one another electrically by means of an air gap, and the three electrodes being spring-suspended mechanically, independently of one another.

2. A device according to claim 1 wherein the three electrodes are connected to current impulse source means for producing separate current impulses for the respective outer electrodes, and wherein the central electrode is connected as a common path for carrying the separate current impulses.

3. A device according to claim 1 wherein the inside electrode and the outside electrodes are movable independently of one another and the inside electrode is movable down ahead of the outside electrodes.

4. A device for repairing conductor path breaks on printed circuit boards by means of micro-resistance welding a specific shaped part as a bridge across both sides of the conductor path break, comprising: a three-part electrode system formed of a central inside electrode equipped with a vacuum connection means for sucking-on the shaped part, and on each side of the central electrode an outside electrode being provided, the three electrodes being separated from one another electrically by means of an air gap, and the central electrode being movable independently of the two outside electrodes.

5. A method for repairing conductor path interruptions on printed circuit boards by means of micro-resistance welding a specific shaped part at both sides of the conductor path interruption, comprising the steps of: providing a three-part electrode system formed of a central inside electrode with a vacuum connection and two outer electrodes on each side of the central electrode; sucking-on the shaped part at the end of the central electrode; moving the central electrode to place the shaped part at the interruption; moving the two outer electrodes down into contact with ends of the shaped part where a micro-resistance weld is desired; applying a first micro-resistance welding pulse between one of the outer electrodes and the central electrode; and providing another micro-resistance welding pulse after the first welding pulse to the other outside electrode and central electrode.

* * * * *